US010699982B2

(12) United States Patent
Baek (10) Patent No.: US 10,699,982 B2
(45) Date of Patent: Jun. 30, 2020

(54) SEMICONDUCTOR PACKAGE AND METHOD OF MANUFACTURING THE SAME

(71) Applicant: Samsung Electro-Mechanics Co., Ltd., Suwon-si (KR)

(72) Inventor: Yong-Ho Baek, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/272,484

(22) Filed: Feb. 11, 2019

(65) Prior Publication Data

US 2019/0198410 A1    Jun. 27, 2019

Related U.S. Application Data

(62) Division of application No. 15/079,074, filed on Mar. 24, 2016, now abandoned.

(30) Foreign Application Priority Data

Jun. 18, 2015  (KR) .................... 10-2015-0086885

(51) Int. Cl.
    *H01L 23/31*      (2006.01)
    *H01L 21/56*      (2006.01)
    *H01L 23/498*     (2006.01)
    *H01L 23/00*      (2006.01)
    *H01L 23/538*     (2006.01)
    *H01L 21/48*      (2006.01)

(52) U.S. Cl.
    CPC .......... *H01L 23/315* (2013.01); *H01L 21/563* (2013.01); *H01L 21/565* (2013.01); *H01L 23/3114* (2013.01); *H01L 23/3128* (2013.01); *H01L 23/49838* (2013.01); *H01L 23/5385* (2013.01); *H01L 23/5389* (2013.01); *H01L 24/19* (2013.01); *H01L 24/20* (2013.01); *H01L 21/486* (2013.01); *H01L 21/4857* (2013.01); *H01L 23/49811* (2013.01); *H01L 23/49822* (2013.01); *H01L 23/49827* (2013.01); *H01L 2224/04105* (2013.01); *H01L 2224/12105* (2013.01); *H01L 2224/32225* (2013.01); *H01L 2224/32245* (2013.01); *H01L 2224/73267* (2013.01); *H01L 2224/92244* (2013.01); *H01L 2924/15153* (2013.01)

(58) Field of Classification Search
    CPC ... H01L 21/563; H01L 21/565; H01L 23/315; H01L 23/3114; H01L 23/28
    See application file for complete search history.

(56) References Cited

U.S. PATENT DOCUMENTS

6,358,630 B1    3/2002  Tsukada et al.
6,365,963 B1    4/2002  Shimada
6,861,288 B2    3/2005  Shim et al.
(Continued)

*Primary Examiner* — Phat X Cao
(74) *Attorney, Agent, or Firm* — NSIP Law (57) ABSTRACT

A semiconductor package and a method of manufacturing a semiconductor package are disclosed. The semiconductor package including a first substrate including a first cavity, a cavity mold configured to be inserted into the first cavity and including a second cavity, an electronic component inserted in the second cavity, and a second substrate formed on a surface of the first substrate, a surface of the cavity mold and a surface of the electronic component.

9 Claims, 7 Drawing Sheets

(56) References Cited

U.S. PATENT DOCUMENTS

| | | | |
|---|---|---|---|
| 2008/0007927 A1* | 1/2008 | Ito | H01L 23/49822 |
| | | | 361/764 |
| 2008/0265383 A1* | 10/2008 | Brunnbauer | H01L 21/561 |
| | | | 257/659 |
| 2009/0188703 A1 | 7/2009 | Ito et al. | |
| 2010/0097080 A1 | 4/2010 | Kobayashi et al. | |
| 2011/0056740 A1 | 3/2011 | Takano | |
| 2013/0056703 A1 | 3/2013 | Elian et al. | |
| 2013/0075902 A1 | 3/2013 | Chow et al. | |
| 2015/0014855 A1 | 1/2015 | Yap et al. | |
| 2015/0016049 A1 | 1/2015 | Lim | |
| 2015/0173258 A1 | 6/2015 | Chen et al. | |
| 2015/0262972 A1* | 9/2015 | Katkar | H01L 21/561 |
| | | | 257/48 |
| 2016/0005628 A1 | 1/2016 | Yap et al. | |
| 2016/0163650 A1* | 6/2016 | Gao | H01L 23/49827 |
| | | | 257/773 |
| 2016/0254236 A1* | 9/2016 | Kim | H01L 23/3114 |
| | | | 257/659 |

\* cited by examiner

SEMICONDUCTOR PACKAGE AND METHOD OF MANUFACTURING THE SAME

CROSS-REFERENCE TO RELATED APPLICATIONS

This application is divisional application of U.S. patent application Ser. No. 15/079,074 filed on Mar. 24, 2016, which claims the benefit under 35 USC § 119(a) of Korean Patent Application No. 10-2015-0086885, filed with the Korean Intellectual Property Office on Jun. 18, 2015, the entire disclosure of which is incorporated herein by reference for all purposes.

BACKGROUND

1. Field

The following description relates to a semiconductor package and a method of manufacturing a semiconductor package.

2. Description of Related Art

The rapid advancement of semiconductor technologies has seen active development in semiconductor packages, such as, for example, system in package (SIP), chip sized package (CSP) and flip chip package (FCP), in which an electronic component such as a semiconductor device is preinstalled in a printed circuit board and configured as a package.

As electronic components become increasingly smaller and more integrated, the number of inputs and outputs have increased, and thus the number of pads of a package board in which the electronic component is installed is increased. Accordingly, the package board is required to have a fine pitch, thereby increasing the manufacturing cost of the package board. In order to address the fine pitch of the package board, an interposer has been conventionally formed between the electronic component and the package board.

The related art of the present description is disclosed in U.S. Pat. No. 6,861,288. All documents cited in the present disclosure, including published documents, patent applications, and patents, may be incorporated herein in their entirety by reference in the same manner as when each cited document is separately and specifically incorporated or incorporated in its entirety.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect there is provided a package board and a method of manufacturing a package board in which a redistribution layer or an interposer may be omitted.

In another general aspect there is provided a package board and a method of manufacturing a package board having a high-conformity, high-density circuit layer.

In another general aspect there is provided a semiconductor package including a first substrate including a first cavity, a cavity mold configured to be inserted into the first cavity and including a second cavity, an electronic component inserted in the second cavity, and a second substrate formed on a surface of the first substrate, a surface of the cavity mold and a surface of the electronic component.

A plurality of electronic components may be disposed above the second substrate.

The cavity mold may include a plurality of first cavities configured to receive the plurality of electronic components.

The cavity mold may be made of an insulating material.

The cavity mold may be made of a prepreg.

The cavity mold may be made at least one of a prepreg, a metal, or a ceramic.

Another surface of the cavity mold and another surface of the electronic component may be placed on a same plane.

The second substrate includes an insulating layer and a circuit layer, and the insulating layer may be made of a photosensitive insulating material.

The first substrate includes an insulating layer and a circuit layer.

The cavity mold may be configured to prevent the insulating layer from flowing into the electronic component.

A surface of the cavity mold in which the electronic component may be inserted is flat.

In another general aspect there is provided a method of manufacturing a semiconductor package including including preparing a first substrate including a first cavity formed, preparing a cavity mold including a second cavity, inserting an electronic component in the second cavity, inserting the cavity mold in the first cavity, and forming a second substrate on a surface of the first substrate, a surface of the cavity mold, and a surface of the electronic component.

The cavity mold may be made of an insulating material.

The cavity mold may be made of a prepreg.

The cavity mold may be made of a metal or a ceramic.

The second cavity may include a plurality of cavities formed thereon.

The inserting of the electronic component may include inserting a plurality of electronic components in the plurality of second cavities.

Another surface of the cavity mold and another surface of the electronic component may be placed on a same plane.

The second substrate may include an insulating layer and a circuit layer, and the insulating layer may be made of a photosensitive insulating material.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein.

However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Figure 1:
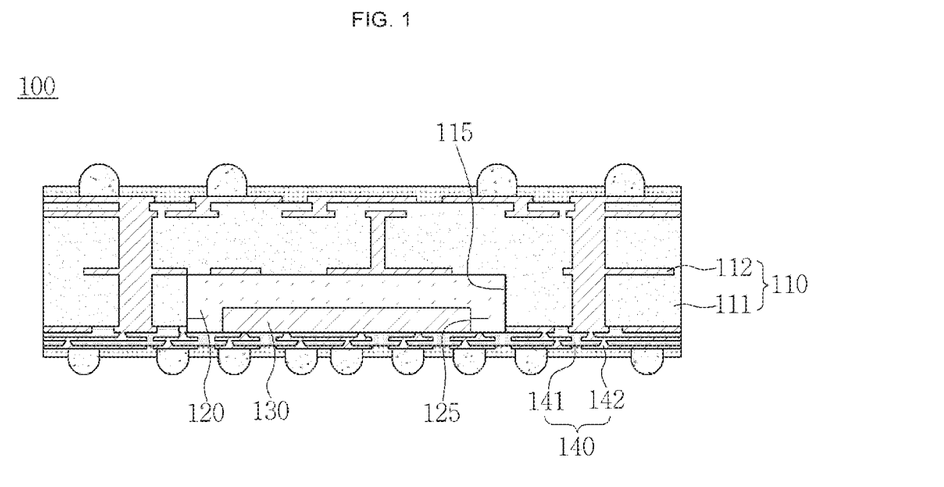
FIG. 1 is a diagram illustrating an example of a semiconductor package.

FIG. 1 illustrates an example of a semiconductor package in accordance with a first embodiment.

Referring to FIG. 1, a semiconductor package 100 includes a first substrate 110, a cavity mold 120, an electronic component 130 and a second substrate 140.

The first substrate 110 includes at least one layer of first insulating layer 111 and first circuit layer 112.

The first insulating layer 111 is made of a composite polymer resin that is commonly used for an interlayer insulating material. For instance, the first insulating layer 111 is made of an epoxy resin, such as, for example, a prepreg, an ajinomoto build-up film (ABF), flame retardant 4 (FR-4), or bismaleimide triazine (BT).

The first circuit layer 112 is made of a conductive material. For example, the first circuit layer 112 is made of copper. However, the material for the first circuit layer 112 is not limited to copper only, and it is possible that the first circuit layer 112 is made of any circuit-forming conductive material known in the field of circuit board.

A first cavity 115 is formed in the first substrate 110. The first cavity 115 is formed on one surface of the first substrate 110. In this example, the surface of the first substrate 110 on which the first cavity 115 is formed is in contact with or electrically connected with the second substrate 140.

A size and a shape of the first cavity 115 is such that it is adequate for the cavity mold 120 to be fixed to the first substrate 110 when the cavity mold 120 is inserted in the first cavity 115.

The cavity mold 120 is inserted into and fixed to the first cavity 115 of the first substrate 110. A second cavity 125 is formed in the cavity mold 120. The second cavity 125 is formed on one surface of the cavity mold 120. In this example, the surface of the cavity mold 120 on which the second cavity 125 is formed is in contact with the second substrate 140.

A size and a shape of the second cavity 125 is such that it is adequate for the electronic component 130 to be fixed to the cavity mold 120 when the electronic component 130 is inserted in the second cavity 125.

The cavity mold 120 is made of an insulating material. For instance, the cavity mold 120 is made of a prepreg. In another example, the cavity mold 120 is made of a metal or a ceramic. By having the cavity mold 120 made of a metal or a ceramic, a heat generated by the electronic component 130 may be transferred outside. Accordingly, a heat dissipating property of the semiconductor package 100 may be improved by forming the cavity mold 120 with metal or ceramic.

The cavity mold 120 protects the electronic component 130 when the cavity mold 120 is inserted in the first substrate 110 or when the second substrate 140 is formed. The cavity mold 120 functions as a protective wall such that the first insulating layer 111 of the first substrate 110 does not flow to the electronic component 130. Since the cavity mold 120 prevents the first insulating layer 111 from flowing, it is possible to form the semiconductor package 100 to be designed precisely.

The electronic component 130 is inserted in the second cavity 125 of the cavity mold 120. The electronic component 130 remains inserted in the cavity mold 120 when the electronic component 130 is arranged above the second substrate 140. Moreover, it is possible for the electronic component 130 to be electrically connected with the first substrate 110.

In this example, the electronic component 130 may be any kind of component that can be installed in the semiconductor package 100.

In this example, the cavity mold 120 and the electronic component 130 may be aligned in such a way that one surface of the cavity mold 120 and one surface of the electronic component 130 are on a same plane.

Since the cavity mold 120 is inserted in and fixed to the first cavity 115 of the first substrate 110, the electronic component 130 is prevented from being tilted. Accordingly, the electronic component 130 is affixed at its intended position. Therefore, it is possible to have a high conformity among the first substrate 110, the electronic component 130, and the second substrate 140.

In an example, the second substrate 140 includes at least one layer of second insulating layer 141 and second circuit layer 142. The second insulating layer 141 is made of a photosensitive material, among interlayer insulating materials commonly used in the field of circuit board.

The second circuit layer 142 is made of a conductive material. For example, the second circuit layer 142 is made of copper. However, the material for the second circuit layer 142 is not limited to copper, and it is possible that the second circuit layer 142 is made of any circuit-forming conductive material known in the field of circuit board.

In an example, since the second substrate 140 has a circuit layer formed on a photosensitive insulating material, it is possible to realize a fine pitch in the second circuit layer 142. Accordingly, it is possible to omit an additional redistribution layer and interposer.

Figure 2:
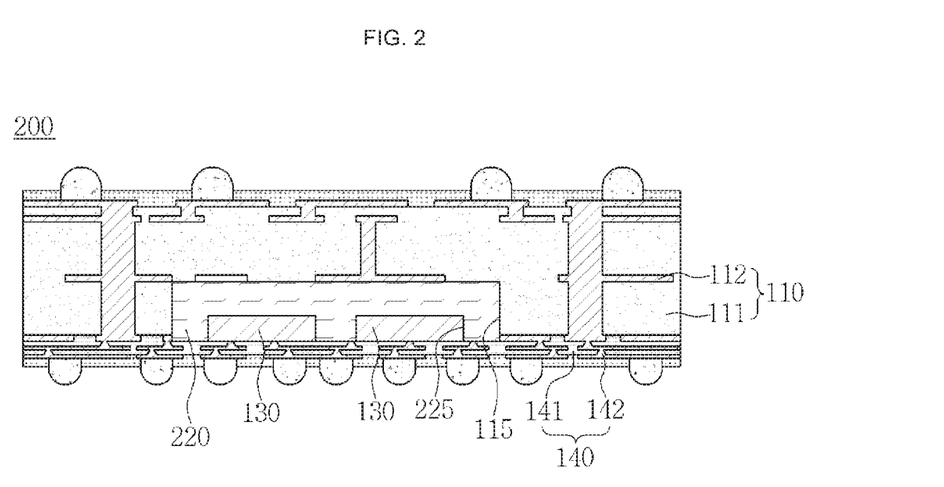
FIG. 2 is a diagram illustrating an example of a semiconductor package.

FIG. 2 illustrates another example of a semiconductor package. Referring to FIG. 2, a semiconductor package 200 in includes a first substrate 110, a cavity mold 220, an electronic component 130 and a second substrate 140.

The first substrate 110 and the second substrate 140 shown in FIG. 2 are similar to the first substrate 110 (shown in FIG. 1) and the second substrate 140 (shown in FIG. 1). The above description of FIG. 1, is also applicable to FIG.

2, and is incorporated herein by reference. Thus, the above description may not be repeated here.

The cavity mold 220 and the electronic component 130 as shown in FIG. 2 are similar to the cavity mold 120 (shown in FIG. 1) and the electronic component 130 (shown in FIG. 1). The above description of FIG. 1, is also applicable to FIG. 2, and is incorporated herein by reference. Thus, the above description may not be repeated here. But, some differences between the cavity mold 220 and the electronic component 130 of FIG. 2 and the cavity mold 120 and the electronic component 130 of FIG. 1 will be described herein.

As shown in FIG. 2, a plurality of second cavities 225 are formed in the cavity mold 220. In this example, a plurality of electronic components 130 are provided in the plurality of second cavities 225. The second cavities 225 are each formed to have a size and a shape that is sufficient for the electronic component 130 to be inserted into and fixed to the second cavity 225.

As illustrated in FIG. 2, the plurality of electronic components 130 are each inserted into and fixed to the corresponding second cavity 225. Accordingly, one surface of the plurality of electronic components 130 and one surface of the cavity mold 220 may be aligned on a same plane. The plurality of electronic components 130 may be prevented from being tilted. Accordingly, it is possible to have a high conformity among the first substrate 110, the plurality of electronic components 130 and the second substrate 140.

The cavity mold 220, having the plurality of electronic components 130 inserted therein, is inserted in a first cavity 115 of the first substrate 110. The second substrate 140 is placed below the first substrate 110, the cavity mold 220, and the plurality of electronic components 130.

Figure 3:
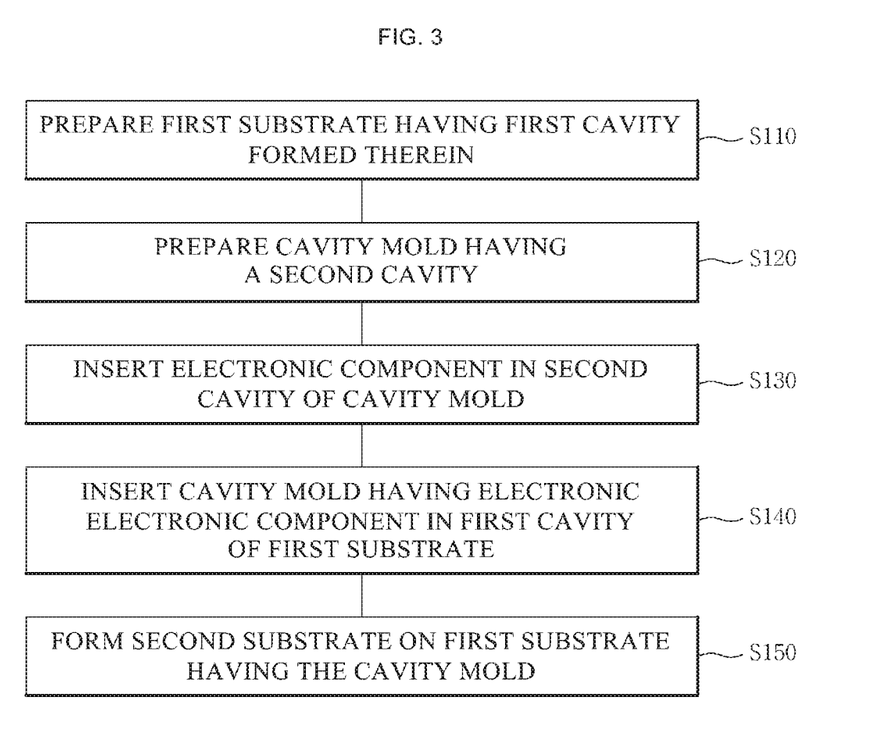
FIG. 3 is a diagram illustrating an example of a method of forming the package board.

FIG. 3 is a diagram illustrating an example of a method of forming the package board. FIG. 4 through FIG. 12 illustrate examples of a method of forming the semiconductor package. The method shown in FIG. 3 will be described with reference to FIG. 4 through FIG. 12. The operations in FIG. 3 may be performed in the sequence and manner as shown, although the order of some operations may be changed or some of the operations omitted without departing from the spirit and scope of the illustrative examples described. Many of the operations shown in FIG. 3 may be performed in parallel or concurrently. The above descriptions of FIGS. 1-2, is also applicable to FIG. 3, and is incorporated herein by reference. Thus, the above description may not be repeated here.

Figure 4:
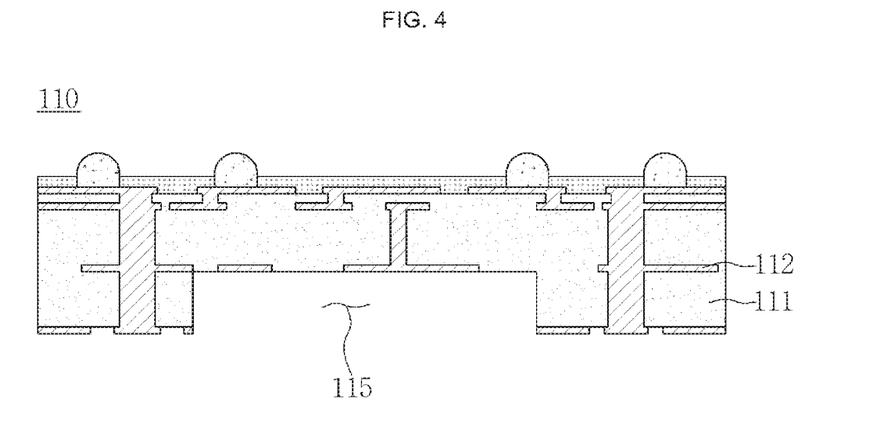
FIG. 4 through FIG. 12 are diagrams illustrating examples of a method of forming the semiconductor package.

In S110, referring to FIG. 4, a first substrate 110 having a first cavity 115 formed therein is prepared. The first substrate 110 includes at least one layer of first insulating layer 111 and first circuit layer 112.

As described above, the first insulating layer 111 is made of a composite polymer resin that is commonly used for an interlayer insulating material. For instance, the first insulating layer 111 is made of an epoxy resin, for example, a prepreg, an ajinomoto build-up film (ABF), flame retardant 4 (FR-4), or bismaleimide triazine (BT).

The first circuit layer 112 is made of a conductive material. For example, the first circuit layer 112 is made of copper. However, the material for the first circuit layer 112 is not limited to copper only, and it is possible that the first circuit layer 112 is made of any circuit-forming conductive material known in the field of circuit board.

The first cavity 115 is formed in the first substrate 110. The first cavity 115 is formed on one surface of the first substrate 110. In this example, the surface of the first substrate 110 on which the first cavity 115 is formed is in contact with or electrically connected with a second substrate 140.

The first cavity 115 has a size and a shape that is adequate for a cavity mold 120 to be fixed to the first substrate 110 when the cavity mold 120 is inserted in the first cavity 115.

In this example, the first substrate 110 may be formed using any method of forming an insulating layer, a circuit layer and a cavity that is known in the field of circuit board.

Figure 5:
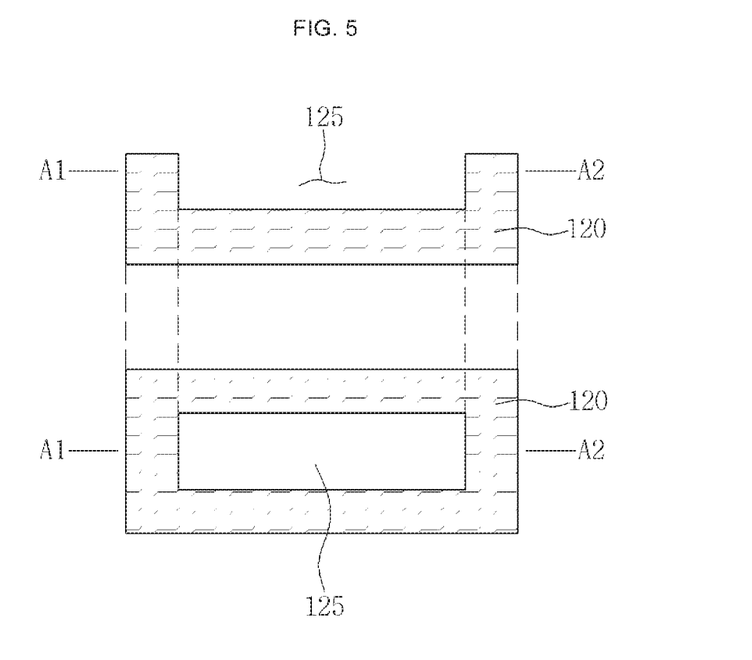
Figure 6:
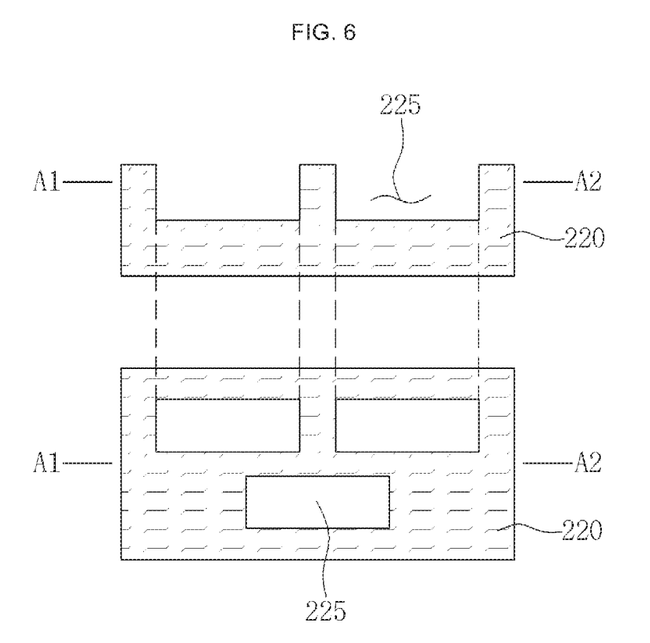

In S120, referring to FIG. 5 and FIG. 6, the cavity mold 120 having a second cavity 125 formed therein is prepared.

FIG. 5 illustrates an example of the cavity mold 120 in accordance with the example disclosed in FIG. 1, and FIG. 6 illustrates an example of the cavity mold 120 in accordance with the example disclosed in FIG. 2.

The cavity mold 120 as shown in FIGS. 5 and 6 are made of an insulating material. For instance, the cavity mold 120 is made of a prepreg. Alternatively, the cavity mold 120 is made of metal or ceramic. By having the cavity mold 120 made of metal or ceramic, heat generated by an electronic component (not shown), which is to be inserted later, may be transferred outside the electronic component. Accordingly, a heat dissipating property of a semiconductor package may be improved by forming the cavity mold 120 with metal or ceramic.

In an example, the cavity mold 120 may have the second cavity 125, as shown in FIG. 5. In another example, the cavity mold 220 may have the second cavity 225, as shown in FIG. 6. The second cavity 125 and 225 may be formed on one surface of the cavity mold 120 and 220, respectively.

Referring to FIG. 5, the cavity mold 120 has one second cavity 125 formed therein. In this example, the second cavity 125 is formed to have a size and a shape sufficient for one electronic component (not shown), which is to be inserted in and fixed to the second cavity 125.

Referring to FIG. 6, a cavity mold 220 in accordance with the second embodiment has a plurality of second cavities 225 formed therein.

Figure 7:
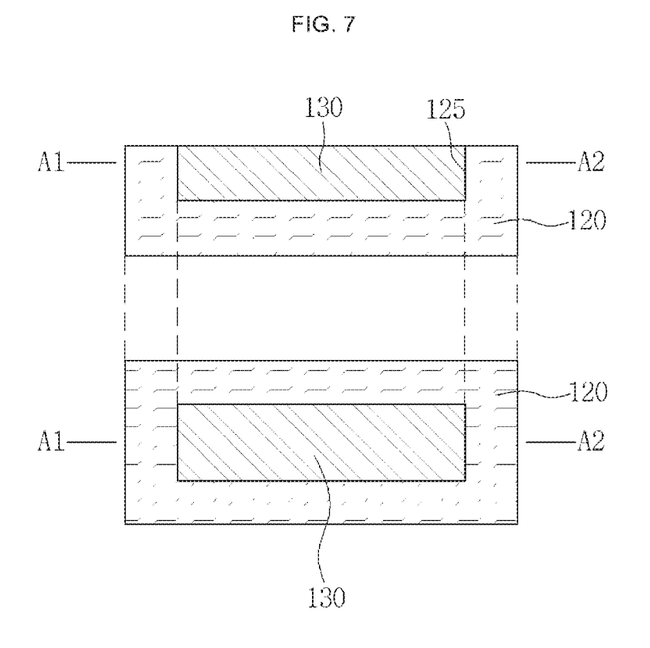
Figure 8:
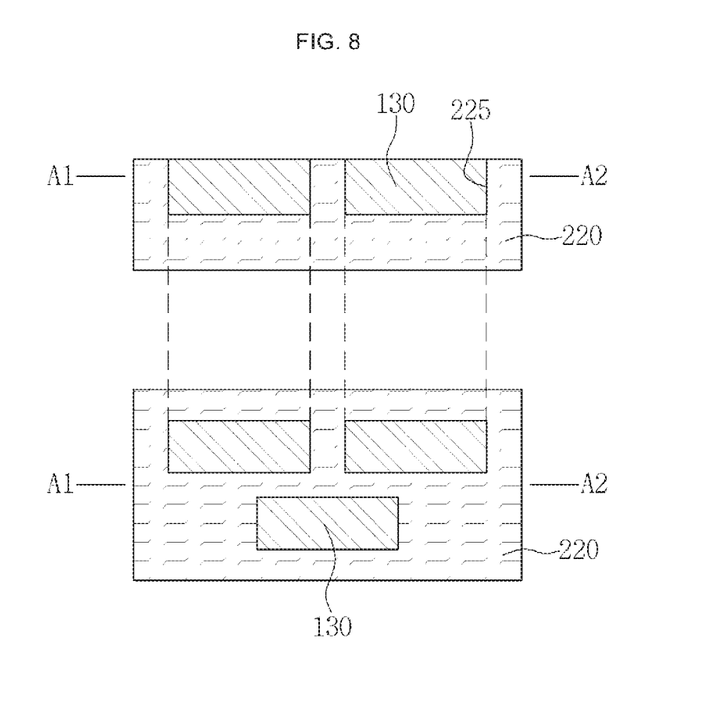

In S130, referring to FIG. 7 and FIG. 8, an electronic component 130 is inserted in the second cavity 125, 225 of the cavity mold 120, 220, respectively.

Referring to FIG. 7, the electronic component 130 is inserted in the cavity mold 120. As shown in FIG. 7, a single electronic component 130 is inserted into the second cavity 125 of the cavity mold 120. Since the second cavity 125 has the same size and shape as those of the electronic component 130, the electronic component 130 is fixed in the cavity mold 120.

As shown in FIG. 7, when the electronic component 130 is inserted in the cavity mold 120, one surface of the cavity mold 120 and one surface of the electronic component 130 are placed on a same plane. Accordingly, the one surface of the cavity mold 120 in which the electronic component 130 is inserted is flat.

Referring to FIG. 8, a plurality of electronic components 130 are inserted in the cavity mold 220. As shown in FIG. 8, 3 electronic components 130 are inserted into the three second cavities 225 of the cavity mold 220. In this example, since each of the three second cavities 225 has the same size and shape as those of the electronic component 130 being inserted therein, the 3 electronic components 130 are fixed in the cavity mold 220.

As shown in FIG. 8, when the plurality of electronic components 130 are inserted in the cavity mold 220, one surface of the cavity mold 220 and one surface of the plurality of electronic components 130 are placed on a same plane. Accordingly, the one surface of the cavity mold 220 in which the plurality of electronic components 130 are inserted is flat.

Since the electronic component 130 is inserted in and fixed to the cavity mold 120 and 220, the electronic component 130 is prevented from being tilted. Accordingly, the electronic component 130 is prevented from slipping out or escaping when the electronic component 130 is to be arranged.

Figure 9:
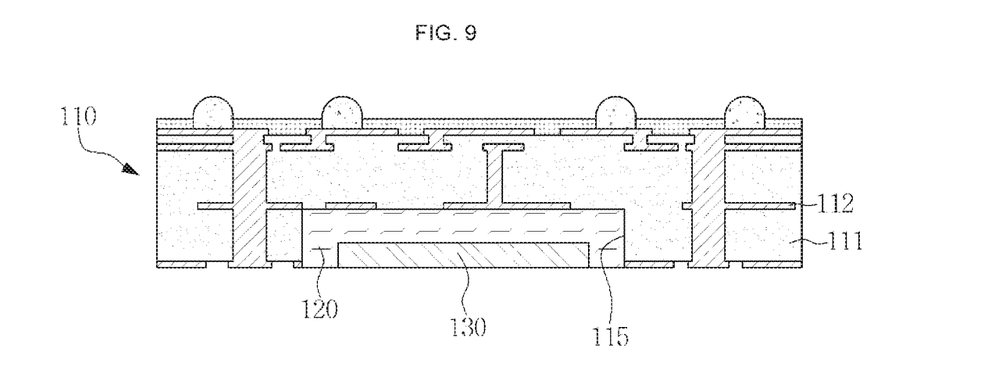
Figure 10:
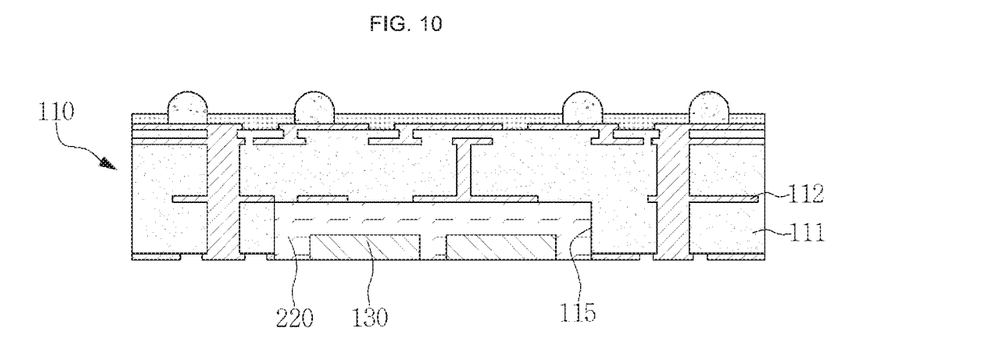

In S140, referring to FIG. 9 and FIG. 10, the cavity mold 120, 220 in which the electronic component 130 is inserted is inserted in the first cavity 115 of the first substrate 110.

As shown in FIGS. 9 and 10, the cavity mold 120 is inserted in the first cavity 115 of the first substrate 110. In this example, since the first cavity 115 has the same size and shape as those of the cavity mold 120, the cavity mold 120 is fixed when it is inserted in the first substrate 110.

As shown in FIGS. 9 and 10, when the cavity mold 120 and 220 are inserted in the first substrate 110, one surface of the first substrate 110 and one surface of the cavity mold 120 and 220 are placed on a same plane. Accordingly, one surface of the first substrate 110 in which the cavity mold 120 and 220 is inserted is flat.

As shown in FIGS. 9 and 10, when the cavity mold 120 and 220 are inserted in the first substrate 110, the cavity mold 120 and 220 prevents the first insulating layer 111 from flowing toward the electronic component 130. Since the cavity mold 120 and 220 prevents the first insulating layer 111 from flowing, it is possible to form and dispose the first substrate 110, the cavity mold 120 and 220, the electronic component 130, and the second substrate (not shown), which is to be formed later, precisely as designed.

Figure 11:
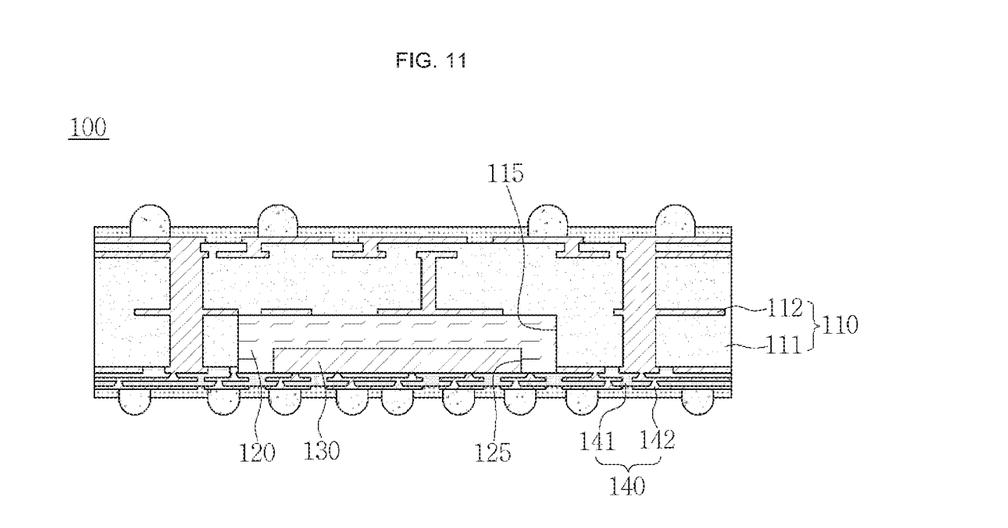
Figure 12:
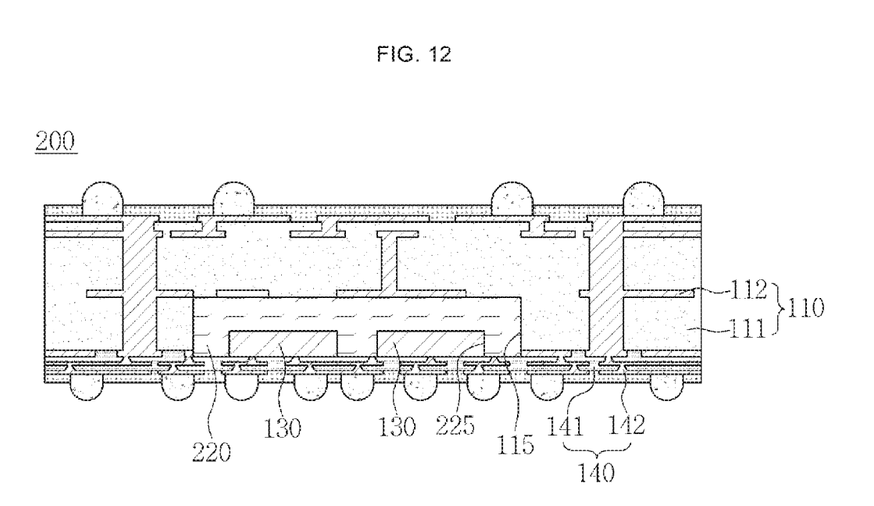

In S150, referring to FIG. 11 and FIG. 12, the second substrate 140 is formed on the first substrate 110 in which the cavity mold 120 and 220 is inserted.

According to an example, the second substrate 140 is formed on a surface of the first substrate 110, a surface of the cavity mold 120 and 220 and a surface of the electronic component 130. The second substrate 140 includes at least one layer of second insulating layer 141 and second circuit layer 142.

The second insulating layer 141 is made of a photosensitive material from interlayer insulating materials commonly used in the field of circuit board.

The second circuit layer 142 is made of a conductive material such as, for example, copper. However, the material for the second circuit layer 142 is not limited to copper only, and the second circuit layer 142 may be made of any circuit-forming conductive material known in the field of circuit board.

According to an example, one surface of the first substrate 110, one surface of the cavity mold 120 and 220 and one surface of the electronic component 130 are placed on a same plane. Thus the first substrate 110, the cavity mold 120 and 220 and the electronic component 130 have one common flat surface. The second substrate 140 is formed on this common flat surface. The second substrate 140 is formed with the electronic component 130 remaining fixed to the cavity mold 120 and 220. Accordingly, it is possible to have a high conformity between the second substrate 140 and the electronic component 130 and between the second substrate 140 and the first substrate 110. Since the second substrate 140 includes the second insulating layer 141 made of a photosensitive material, it is possible to realize the second substrate 140 with a fine pitch. As the high conformity and the fine pitch are realized, the second substrate 140 may serve as a redistribution layer or an interposer. In other words, the semiconductor package 100 and 200 may omit the redistribution layer or the interposer. Moreover, since the redistribution layer or the interposer may be omitted, it is possible to reduce a thickness of the semiconductor package 100 and 200.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a semiconductor package, comprising:
    preparing a first substrate comprising a first cavity formed;
    preparing a cavity mold comprising a second cavity;
    inserting an electronic component in the second cavity;
    inserting the cavity mold in which the electronic component is inserted in the first cavity; and
    forming a second substrate on a surface of the first substrate, a surface of the cavity mold, and a surface of the electronic component,
    wherein a material of the cavity mold in contact with a side surface of the electronic component comprises a same material as a material of the cavity mold in contact with a surface of the electronic component opposite to the surface of the electronic component on which the second substrate is formed.

2. The method as set forth in claim 1, wherein the cavity mold is made of an insulating material.

3. The method as set forth in claim 2, wherein the cavity mold is made of a prepreg.

4. The method as set forth in claim 1, wherein the second substrate comprises an insulating layer and a circuit layer, and the insulating layer is made of a photosensitive insulating material.

5. The method as set forth in claim 1, wherein the cavity mold is made of a metal or a ceramic.

6. The method as set forth in claim 1, wherein the second cavity comprises a plurality of cavities formed thereon.

7. The method as set forth in claim 6, wherein the inserting of the electronic component comprises inserting a plurality of electronic components in the plurality of second cavities.

8. The method as set forth in claim 1, wherein a first surface of the first substrate, a first surface of the cavity mold, and a first surface of the electronic component are on a same plane.

9. The method as set forth in claim 8, wherein a second surface of the cavity mold, and a second surface of the electronic component are placed on a same plane.

* * * * *